(12) United States Patent
Kobayashi et al.

(10) Patent No.: US 8,536,931 B2
(45) Date of Patent: Sep. 17, 2013

(54) BI-FET CASCODE POWER SWITCH

(75) Inventors: Kevin W. Kobayashi, Torrance, CA (US); Joseph Johnson, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/525,927

(22) Filed: Jun. 18, 2012

(65) Prior Publication Data

US 2012/0319758 A1 Dec. 20, 2012

Related U.S. Application Data

(60) Provisional application No. 61/498,105, filed on Jun. 17, 2011.

(51) Int. Cl.
*H03K 17/60* (2006.01)

(52) U.S. Cl.
USPC .......................... 327/430; 327/431; 327/432

(58) Field of Classification Search
USPC .................................................. 327/430–432
See application file for complete search history.

(56) References Cited

U.S. PATENT DOCUMENTS

| 4,663,547 | A | | 5/1987 | Baliga et al. |
| 5,909,128 | A | * | 6/1999 | Maeda ........................ 326/116 |
| 6,005,378 | A | * | 12/1999 | D'Angelo et al. ............ 323/313 |
| 7,719,055 | B1 | * | 5/2010 | McNutt et al. ................ 257/341 |
| 7,728,356 | B2 | | 6/2010 | Suh et al. |
| 7,777,553 | B2 | * | 8/2010 | Friedrichs .................... 327/436 |
| 2010/0258843 | A1 | | 10/2010 | Lidow et al. |

OTHER PUBLICATIONS

Micro GaN, Efficient High-Voltage GaN Decives and ICs for Next Generation Power Management Solutions, 2010, 25 pages, www.microgan.com.

* cited by examiner

*Primary Examiner* — Kenneth B. Wells
(74) *Attorney, Agent, or Firm* — Withrow & Terranova, P.L.L.C.

(57) ABSTRACT

Power switch devices for high-speed applications are disclosed. The power switch device includes a depletion mode field effect transistor (D-FET), an enhancement mode field effect transistor (E-FET) and a bipolar transistor. In one embodiment, the E-FET is coupled in cascode with the D-FET such that turning off the E-FET turns off the D-FET and turning on the E-FET turns on the D-FET. Furthermore, the bipolar transistor is operably associated with the D-FET and the E-FET such that turning on the bipolar transistor drives current from the D-FET through the bipolar transistor to the E-FET to provide a charge that turns on the E-FET. The bipolar transistor provides several advantages such as a higher Schottky breakdown voltage for the E-FET and faster current switching speed for the power switch device.

20 Claims, 10 Drawing Sheets

FREQ (100.0MHz to 10.00GHz)

BI-FET CASCODE POWER SWITCH

RELATED APPLICATIONS

This application claims the benefit of provisional patent application Ser. No. 61/498,105, filed Jun. 17, 2011, the disclosure of which is hereby incorporated herein by reference in its entirety.

FIELD OF THE DISCLOSURE

The disclosure relates to power switch devices for high frequency power applications.

BACKGROUND

Power electronics, such as power supplies, solar energy panels, and electric vehicles, often utilize power switch devices. For example, power switch devices may be utilized in AC to DC converters, DC to AC converters, DC to DC converters, and AC to AC converters within the power electronic devices. However, many challenging design specifications have to be met in order to provide better performance. These design specifications include excellent current-voltage switching capability and quick charge recovery. Also, most consumer electronics require normally-off operation.

In many applications, power switch devices are formed from a depletion mode transistor provided in cascode with enhancement mode transistor. The depletion mode transistor is utilized as the high-voltage device while the enhancement mode transistor provides voltage shifting to turn off the depletion mode transistor. For instance, a power switch device has been formed from an enhancement mode MOSFET in a cascode with a depletion mode junction gate field effect transistor (JFET) or a metal-semiconductor field effect transistor (MESFET). However, the switching speed of the depletion mode JFET or MESFET switch is limited by its current and voltage switching capability and thus limits the switching speed of the power switch device for high voltage applications (>300V).

Gallium Nitride (GaN) High Electron Mobility Transistors (HEMTs) are more conducive to high speed and high voltage switching due to their higher peak electron velocity and wider bandgap as compared to other technologies. Nevertheless, all-GaN solutions are very expensive. In contrast, other solutions have formed a Gallium Arsenide (GaAs) enhancement mode transistor in cascode with a depletion mode GaN HEMT. Unfortunately, the lower gate to source threshold voltage characteristic of the lower bandgap GaAs E-mode device results in a Schottky turn-on voltage at significantly lower input voltages. This premature Schottky gate forward turn-on can degrade and produce adverse switching transients leading to poorer power efficiency.

Accordingly, what is needed is a less expensive arrangement for a power switch device that has high current switching capability while maintaining a higher Schottky breakdown voltage.

SUMMARY

The disclosure relates generally to power switch devices for high-speed applications. The power switch device includes a depletion mode field effect transistor (D-FET), an enhancement mode field effect transistor (E-FET) and a bipolar transistor. In one embodiment, the E-FET is coupled in cascode with the D-FET such that turning off the E-FET turns off the D-FET and turning on the E-FET turns on the D-FET. Furthermore, the bipolar transistor is operably associated with the D-FET and the E-FET such that turning on the bipolar transistor drives current from the D-FET through the bipolar transistor to the E-FET to provide a charge that turns on the E-FET. The bipolar transistor provides several advantages such as a higher Schottky threshold turn-on voltage for the E-FET and faster current switching speed for the power switch device. In this manner, less expensive semiconductor technologies may be utilized to form the power switch device, if desired.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
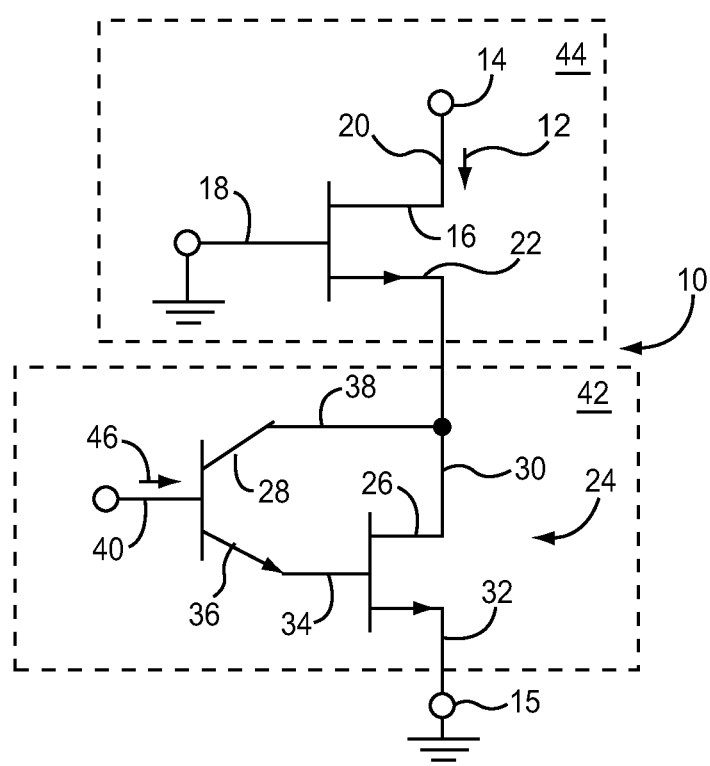
FIG. 1 illustrates a circuit diagram of an exemplary embodiment of one embodiment of a power switch device.

FIG. 1 illustrates one embodiment of a power switch device 10. The power switch device 10 is configured to receive a power supply signal 12. When the power switch device 10 is turned on or activated, the power switch device 10 transmits the power supply signal 12 from an input terminal 14 to an output terminal 15 which (in this example) is coupled to ground. On the other hand, when the power switch device 10 is off or deactivated, the power switch device 10 blocks the power supply signal 12 and the voltage of the power supply signal 12 is dropped across the input terminal 14 and the output terminal 15. The power switch device 10 may thus be used in various power applications that require power switching. For example, the power switch device 10 may be utilized as a switching device for DC to AC converters, AC to AC converters, DC to DC converters, solar cells, battery applications, and/or the like.

As shown in FIG. 1, the power switch device 10 includes a depletion mode field effect transistor (D-FET) 16. In this embodiment, the majority of the voltage is dropped across the D-FET 16 when the power switch device 10 is deactivated. For example, the D-FET 16 may be a Gallium Nitride (GaN) high electron mobility transistor (HEMT) that has been optimized for high voltage operation. The power supply signal 12 may have a voltage of around 1200 volts. Thus, the D-FET may be optimized to have a high breakdown voltage greater than 1200 volts and a channel resistance of approximately 6 ohms-millimeter at the gate periphery. As shown in FIG. 1, the D-FET 16 has a gate 18, a drain 20, and a source 22. The gate 18 may be coupled to ground (in one embodiment) and the D-FET 16 has an activated channel unless a substantial negative voltage is seen between the gate 18 and the source 22.

Most power applications, in particular those involving consumer products, require normally off operation. To provide for normally off operations and turn off the D-FET 16, the power switch device 10 has a power switching driver circuit 24. The power switching driver circuit 24 includes an enhancement mode field effect transistor (E-FET) 26 and a bipolar transistor 28. The E-FET 26 is coupled in cascade with D-FET 16 such that turning off the E-FET 26 turns off the D-FET 16 and turning on the E-FET 26 turns on the D-FET 16. As mentioned above, a negative voltage needs to be seen between the gate 18 of the D-FET 16 and the source 22 of the D-FET 16 in order to turn off the D-FET 16. When the E-FET 26 is turned off a drain 30 of the E-FET 26 is pulled up in potential so as to have a more positive voltage. Accordingly, the D-FET 16 is turned off as a sufficiently negative voltage is seen between the gate 18 and the source 22 of the D-FET 16. However, when the E-FET 26 is turned on, the drain 30 of the E-FET 26 becomes less positive. Accordingly, a magnitude of the negative voltage seen between the gate 18 and the source 22 of the D-FET 16 is smaller and thus the D-FET 16 is turned on. In this embodiment, a source of the E-FET 26 is coupled through the output terminal 15 to ground. A gate 34 of the E-FET 26 is operably associated with an emitter 36 of the bipolar transistor 28.

The bipolar transistor 28 is used to drive current that controls the charging of the gate 34 of the E-FET 26. The bipolar transistor 28 is operably associated with the D-FET 16 and the E-FET 26. In this particular embodiment, a collector 38 of the bipolar transistor 28 is connected to the source 22 of the D-FET 16. In this manner, the collector 38 taps off current from the D-FET 16 and redirects the current to charge the gate 34 of the E-FET 26. This charging current is driven through the emitter 36 of the bipolar transistor 28 to the gate 34.

There are various advantages to the illustrated arrangement shown in FIG. 1. One of these advantages is that bipolar transistors, such as the bipolar transistor 28, are particularly well adapted to driving current and thus allow for the E-FET to be switched on and off rapidly. Another advantage is that an input capacitance of the power switch device 10, as seen from a base 40 of the bipolar transistor 28, is lower. This is because the input capacitance of the bipolar transistor 28 and the E-FET 26 appear in series thereby providing a smaller capacitance value. As a result of the smaller capacitance seen at the base 40, the power switch device 10 can switch faster. Additionally, the bipolar transistor 28 level shifts the operational voltages of the power switch device 10 thereby allowing for greater voltage swings, as explained in further detail below.

As mentioned previously, the bipolar transistor 28 is operably associated with the D-FET 16 and E-FET 26 such that turning on the bipolar transistor 28 drives current from the D-FET 16 through the bipolar transistor 28 to the E-FET 26 to provide the charge that turns on the E-FET 26. There may be various manners of operably associating the bipolar transistor 28 and E-FET 26 to allow the bipolar transistor 28 to drive the current that operates the E-FET 26. In one example, the collector 38 and the emitter 36 are simply directly connected to the drain 30 and gate 34. However, in other embodiments, the bipolar transistor 28 and the E-FET 26 are monolithically integrated into a semiconductor substrate 42. This enables a compact finger layout that can be used to construct the power switching driver circuit 24 of the power switch device 10.

The D-FET 16 may or may not be formed on the semiconductor substrate 42. In this embodiment, the D-FET 16 is formed on a second semiconductor substrate 44 and is an entirely discrete device. Accordingly, the arrangement shown in FIG. 1 allows for the D-FET 16 to be formed on a more expensive substrate while allowing for cheaper and more commonly used semi-conductor substrates to provide the power switching driver circuit 24. For example, the D-FET 16 is formed in the second semiconductor substrate 44, which is a Gallium Nitride (GaN) substrate. The D-FET 16 is a HEMT. Alternatively, the D-FET 16 may be formed on a silicon (Si) substrate or on a Silicon Carbide (SiC) substrate. On the other hand, the semiconductor substrate 42 may be a Gallium Arsenide (GaAs) substrate where the E-FET 26 is a HEMT and the bipolar transistor 28 is a heterojunction bipolar transistor (HBT) monolithically integrated into the semiconductor substrate 42.

As shown in FIG. 1, the bipolar transistor 28 is configured to receive a power switch control signal 46 at the base 40. The bipolar transistor 28 is operable to turn on when the power switch control signal 46 is above a first threshold voltage. This first threshold voltage is the voltage required between the base 40 and the emitter 36 to turn on the bipolar transistor 28. Note however that the E-FET 26 and the bipolar transistor 28 are arranged as a Darlington transistor pair. Accordingly, the power switch device 10 is activated and deactivated in accordance with the voltage level of the power switch control signal 46 received at the base 40 of the bipolar transistor 28. As the bipolar transistor 28 needs to be turned on in order to drive the current that switches on the E-FET 26, the power switch control signal 46 has to reach the threshold voltage of the bipolar transistor 28 before the bipolar transistor 28 begins to charge the gate 34 of the E-FET 26. In one embodiment, the threshold voltage of the bipolar transistor 28 is approximately 1.4 volts from the base 40 to the emitter 36.

After the bipolar transistor 28 is turned on, the E-FET 26 does not turn on until the threshold voltage of the E-FET 26 is reached. In one embodiment, the channel of the E-FET 26 is turned on when there is voltage of approximately 0.4 volts between the gate 34 and the source 32. Since the E-FET 26 and the bipolar transistor 28 are arranged as a Darlington transistor pair, the E-FET 26 is operably associated with the bipolar transistor 28 such that the E-FET 26 is turned on when the power switch control signal 46 is above the threshold voltage of the bipolar transistor 28 added to the threshold voltage of the E-FET 26. Accordingly, the Darlington transistor pair arrangement, the power switch control signal 46 must reach a voltage of approximately 1.7 to 1.8 volts in order to turn on the E-FET 26. The bipolar transistor 28 thus increases the overall threshold voltage of the power switching driver circuit 24 thereby improving the input drive operation of the power switch device 10. Due to the high electron mobility of the semiconductor substrate 42 and due to the use of the bipolar transistor 28 to drive switching, the power switch device 10 can achieve switching speeds of 30 GHz or more with current semi-conductor substrate technology.

As the E-FET 26 is turned on, the E-FET 26 drives the drain 30 and thus the source 22 of the D-FET 16 towards ground. Accordingly, a smaller negative voltage above the pinch off voltage of the D-FET 16 is seen between the gate 18 and the source 22. The D-FET 16 is also turned on thereby allowing the power supply signal 12 to pass through the power supply. The bipolar transistor 28 provides a current tap which provides the charge at the gate 34 of the E-FET 26 in order to turn on the E-FET 26. As the power switch control signal 46 continues to rise to some maximum value, the channel of the E-FET 26 is turned on more and more thereby driving the source 22 of the D-FET 16 less and less positive. In turn, this turns on the channel of the D-FET 16 more and more. Note that since the parasitic capacitance between the base 40 and emitter 36 of the bipolar transistor 28 and the parasitic capacitance between the gate 34 and the source 32 are coupled in series, the input capacitance of the power switch device 10 as seen from the base 40 is substantially reduced in comparison to the parasitic capacitance that would be seen if no bipolar transistor 28 were provided. Moreover, because of the addition of the higher current driving bipolar transistor 28 that drives the gate 18 of the E-FET 26, a relatively smaller bipolar transistor 28 is required which has a relatively smaller base-emitter input capacitance, resulting in an additional reduction in the input capacitance of the overall switch.

To turn off the power switch device 10, the power switch control signal may be provided below the threshold voltage and thus can be provided less than approximately 1.7 and 1.8 volts. As a result, the charge is reduced at the gate 34 which makes the voltage of the drain 30 and the source 22 more positive. As a result, the voltage between the gate 18 and the source 22 of the D-FET is seen as more negative and the magnitude of this negative voltage is greater than the pinch off voltage of the D-FET 16. The E-FET 26 and the D-FET 16 are thus turned off and block the power supply signal 12. Accordingly, the voltage of the power supply signal 12 is dropped across the D-FET 16 and the E-FET 26.

In this embodiment, the D-FET 16 is a HEMT formed on the second semiconductor substrate 44, which is mentioned above, is a GaN substrate. The GaN substrate can be used to its inherent capability in providing transistors, such as the D-FET 16, capable of blocking and handling large voltages. It should be noted that in other embodiments, other types of substrates may be utilized such as Silicon (Si) substrates, Silicon Carbide (SiC) substrates, and/or the like. In the embodiment illustrated in FIG. 1, the D-FET 16 has a breakdown voltage that is significantly higher than the breakdown voltage of the E-FET 26. More specifically, the D-FET 16 can handle voltages greater than 1200 volts while the E-FET 26 can handle voltages around 10-30 volts. However, the E-FET 26 (along with the remainder of the power switching driver circuit 24) are built on the semiconductor substrate 42 which is the GaAs substrate. Generally, GaAs substrate is cheaper than the GaN substrate technology and thus the overall cost of the arrangement shown in FIG. 1 is significantly cheaper than an all GaN substrate solution. However, it should be noted that other embodiments of the power switch device 10 may be implemented using a single semi-conductor substrate, which may be a GaN substrate.

Referring again to FIG. 1, since the bipolar transistor 28 and the E-FET 26 are monolithically integrated into the GaAs substrate and arranged as a Darlington transistor pair, the overall threshold voltage of the power switching circuit is level shifted up by the threshold voltage of the bipolar transistor 28.

Thus, the D-FET 16 and the E-FET 26 start conducting current when the power switch control signal 46 is above approximately 1.7 to 1.8 volts and are fully turned on around 2.2 to 2.3 volts. Since a voltage swing of 2.3 volts is practical for power applications, the power switch device 10 does not need additional ancillary circuitry.

Figure 2:
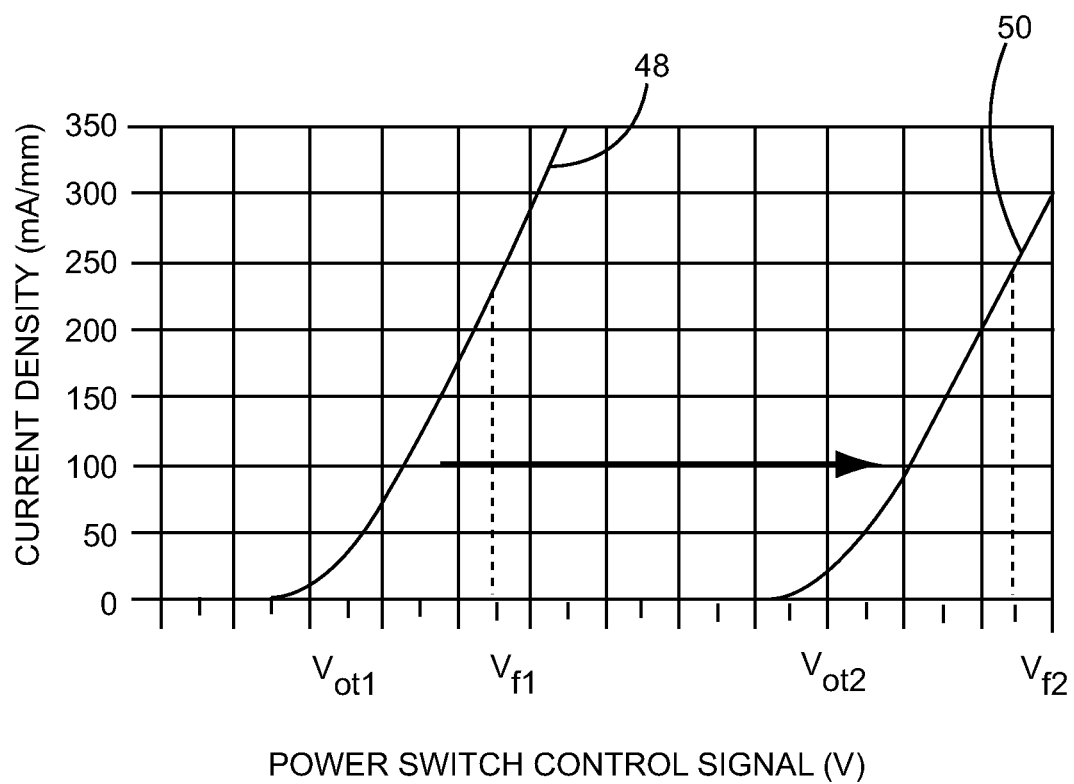
FIG. 2 is a graph of current density versus a voltage of a power switch control signal, wherein one curve is for a power switch device without a bipolar transistor and the other curve is for the power switch device shown in FIG. 1 with the bipolar transistor.

FIG. 2 illustrates current density versus the voltage of the power switch control signal 46 shown in FIG. 1. In particular, curve 48 illustrates the power density characteristic of the D-FET 16 in cascode with the E-FET 26 without the bipolar transistor 28. In other words, the curve 48 is provided as if the power switch control signal 46 were directly received at the gate 34 in the absence of the bipolar transistor 28. On the other hand, curve 50 is the current density characteristic of the power switch device 10 shown in FIG. 1 with the bipolar transistor 28.

As shown by FIG. 2, the bipolar transistor 28 level shifts the response of the power switch device 10 to the power switch control signal 46. Without the bipolar transistor 28, the curve 48 illustrates that the overall threshold voltage $V_{ot1}$ is roughly 0.4 volts and a full turn on current density of roughly 250 mA/mm is achieved at the full turn on voltage $V_{f1}$ of approximately 0.9 volts. However, with the bipolar transistor 28, the overall threshold voltage $V_{ot2}$ is around 1.7 volts and full turn on density of 250 mA/mm is achieved at around 2.3 volts. FIG. 2 thus illustrates the improvement in the overall turn on voltage $V_{ot2}$ and the full turn on voltage $V_{f2}$ provided by the bipolar transistor 28 when monolithically integrated with the E-FET 26 as a Darlington transistor pair.

Figure 3:
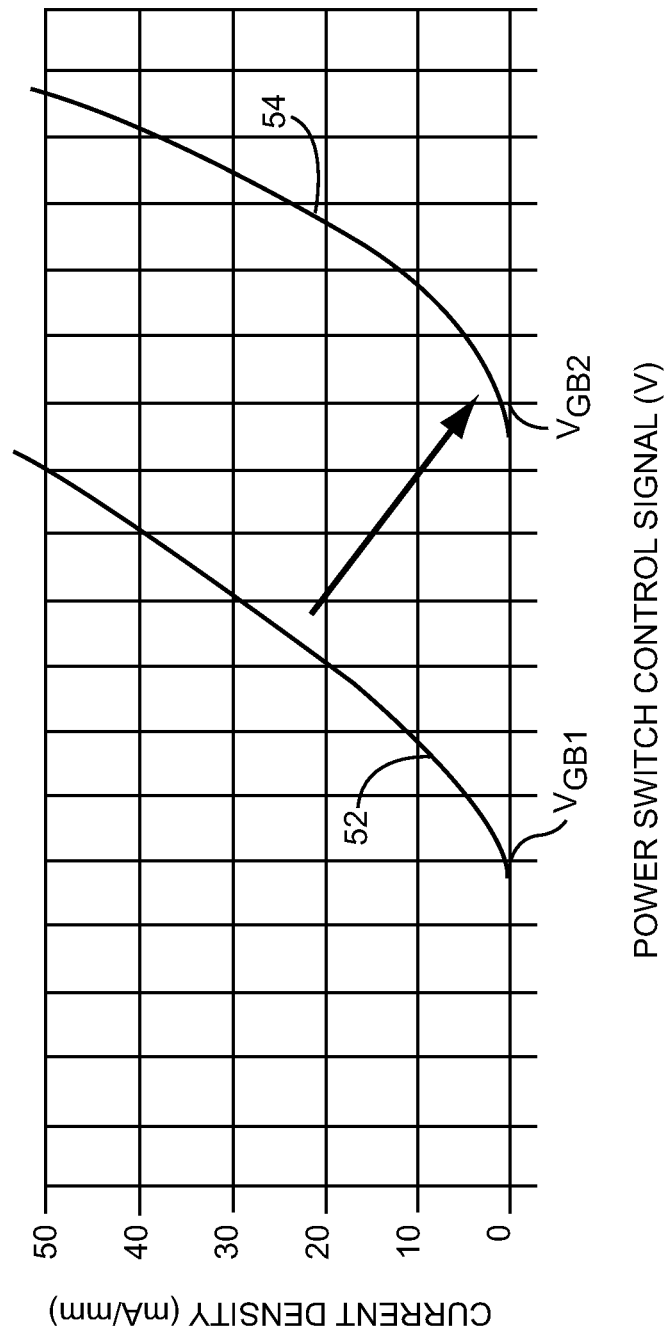
FIG. 3 illustrates a graph of a gate breakdown current density versus the voltage of the power switch control signal, wherein one curve is for the power switch device without the bipolar transistor and the other curve is for the power switch device shown in FIG. 1 with the bipolar transistor.

FIG. 3 illustrates a graph of a gate breakdown current density versus the voltage of the power switch control signal 46. The gate breakdown current occurs when the Schottky barrier between the gate 34 and the drain 30 and/or source 32 breaks down and forward gate conduction results. Curve 52 in the graph illustrates the gate breakdown current density as a function of the voltage of the power switch control signal 46 without the bipolar transistor 28. As shown in FIG. 3, the gate breakdown current does not begin to conduct until the gate breakdown voltage $V_{GB1}$ of approximately 1 volt is reached. Curve 54 illustrates the gate breakdown current density as a function of the voltage of the power switch control signal 46 with the bipolar transistor 28 as shown in FIG. 1. Curve 54 illustrates the improvement in the gate breakdown current since the curve 54 illustrates that the gate 34 does not begin forward conduction until the gate breakdown voltage $V_{GB2}$, which is around 2.4 volts.

Figure 4:
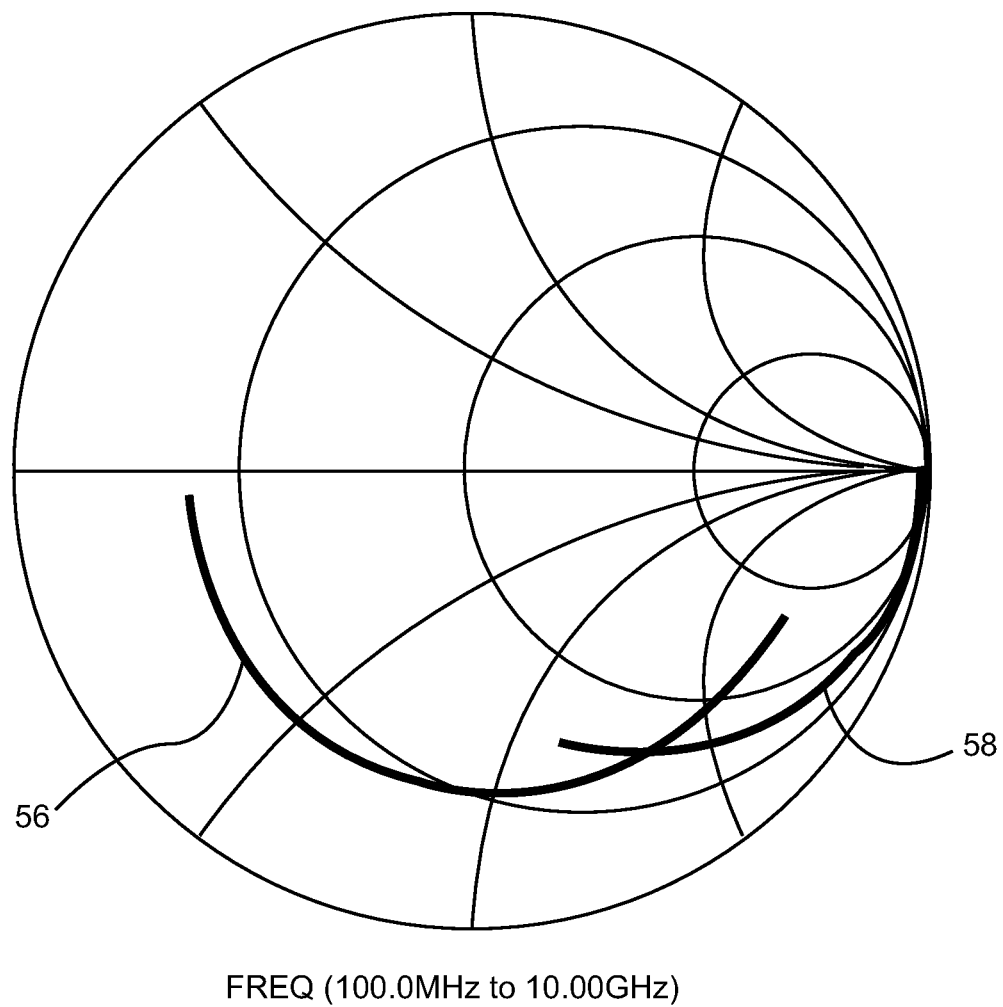
FIG. 4 illustrates a Smith Chart illustrating an input impedance as a function of frequency for the power switch device without the bipolar transistor and an input impedance as a function of frequency for the power switch device shown in FIG. 2 with the bipolar transistor.

FIG. 4 illustrates a Smith Chart of the input impedance as a function of frequency. In particular, curve 56 illustrates the input impedance of the D-FET 16 and the E-FET 26 if no bipolar transistor 28 were provided. Thus, the curve 56 is the input impedance that would be seen at the gate 34 with no bipolar transistor 28. On the other hand, the curve 58 is the input impedance as seen from the base 40 of the bipolar transistor 28. The frequency of the power switch control signal 46 is varied from 100 MHz to 10 GHz in this example. Furthermore, the gate width of the D-FET 16 and the E-FET 26 is provided at approximately 1.6 mm. As shown in FIG. 4, the effective input capacitance is roughly 20 times smaller with the bipolar transistor 28 than without the bipolar transistor 28. In this particular embodiment, the effective input capacitance of the power switch device 10 as seen from the base 40 is approximately 0.19 pF per millimeter while the input capacitance without the bipolar transistor 28 is roughly 3.75 pF per millimeter. Accordingly, the power switch device 10 shown in FIG. 1 not only provides a high overall threshold voltage, a high gate breakdown voltage, but also significantly reduces the effective input capacitance of the power switch device 10.

Figure 5:
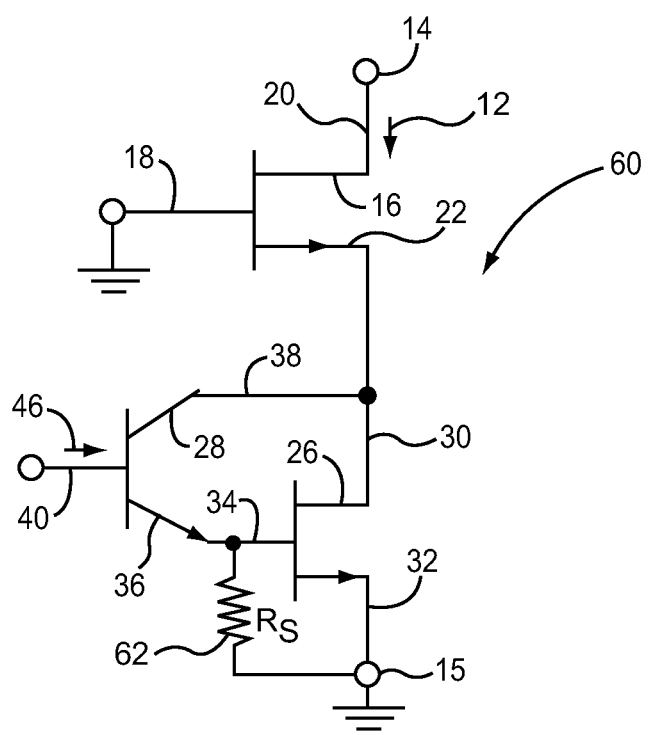
FIG. 5 illustrates yet another embodiment of a power switch device having a resistive component to set a switching speed.

FIG. 5 illustrates yet another embodiment of a power switch device 60. The power switch device 60 shown in FIG. 5 is similar to the power switch device 10 shown in FIG. 1, except a resistive component 62 is coupled between the emitter 36 of the bipolar transistor 28 and the source 32 of the E-FET 26. The resistive component 62 in this embodiment is a passive resistor that has a resistance value of R. The resistive component 62 allows the bipolar transistor 28 to operate with a quiescent current. As a result, the bipolar transistor 28 charges the gate 34 of the E-FET 26 more rapidly. Also, by determining the amount of quiescent current, the resistive value $R_s$ of the resistive component 62 determines the softness or sharpness of the changes in voltage across the input terminal 14 and the output terminal 17. In one example, the D-FET 16 is optimized for a high breakdown voltage greater than 1200 volts and a low channel resistance of approximately 6 ohms-mm. On the other hand, the E-FET 26 is designed to have a low breakdown voltage somewhere between 10 to 15 volts and a lower channel resistance of around 1.5 ohms-mm.

The resistive component 62 provides a slight RC characteristic to the rising edge as the power switch device 60 goes from being activated to deactivate and thereby blocking the power supply signal 12. Higher resistive values slow down this rising edge. This allows for optimization depending on the frequency spectrum characteristics desired for the output voltage of the power switch device 60. In one embodiment, the resistive value $R_s$ is provided around 100 ohms. When the quiescent current is being provided by the bipolar transistor 28, the 100 ohms resistive value provides a current ratio of around 50 to 1 between the base current of the bipolar transistor 28 and the current from the drain 30 to the source 32 of the E-FET 26.

Figure 6:
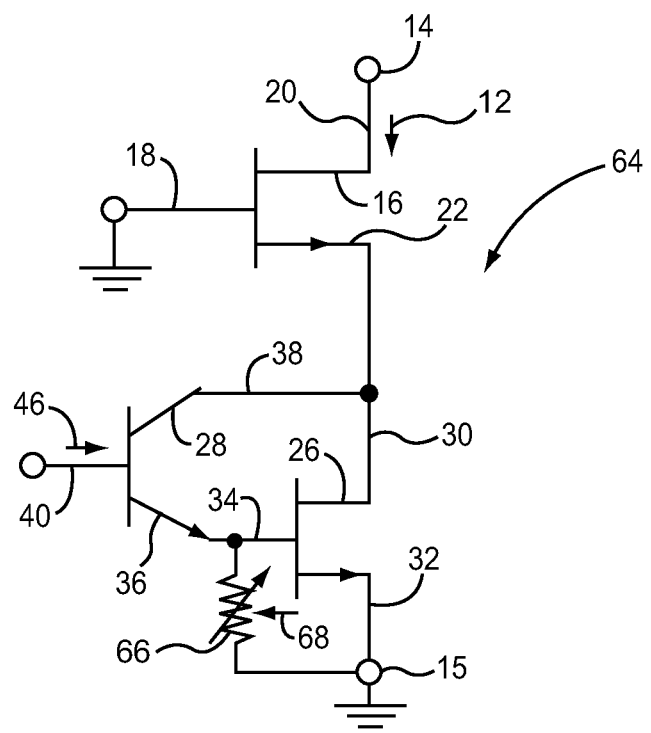
FIG. 6 illustrates another embodiment of the power switch device with a variable resistive component to set a switching speed.

FIG. 6 illustrates another embodiment of the power switch device 64. The power switch device 64 in FIG. 6 is similar to the power switch device 60 shown in FIG. 5 except for the exemplary embodiment of a resistive component 66 connected between the emitter 36 and the source 32. Unlike the resistive component 62 shown in FIG. 5, the resistive component 66 in FIG. 6 is operable to provide a variable resistance. The resistive component 66 may be provided by any type of device that can provide a variable resistance. In this example, the resistance of the resistive component 66 is controlled in accordance with a resistance control signal 68.

Figure 7:
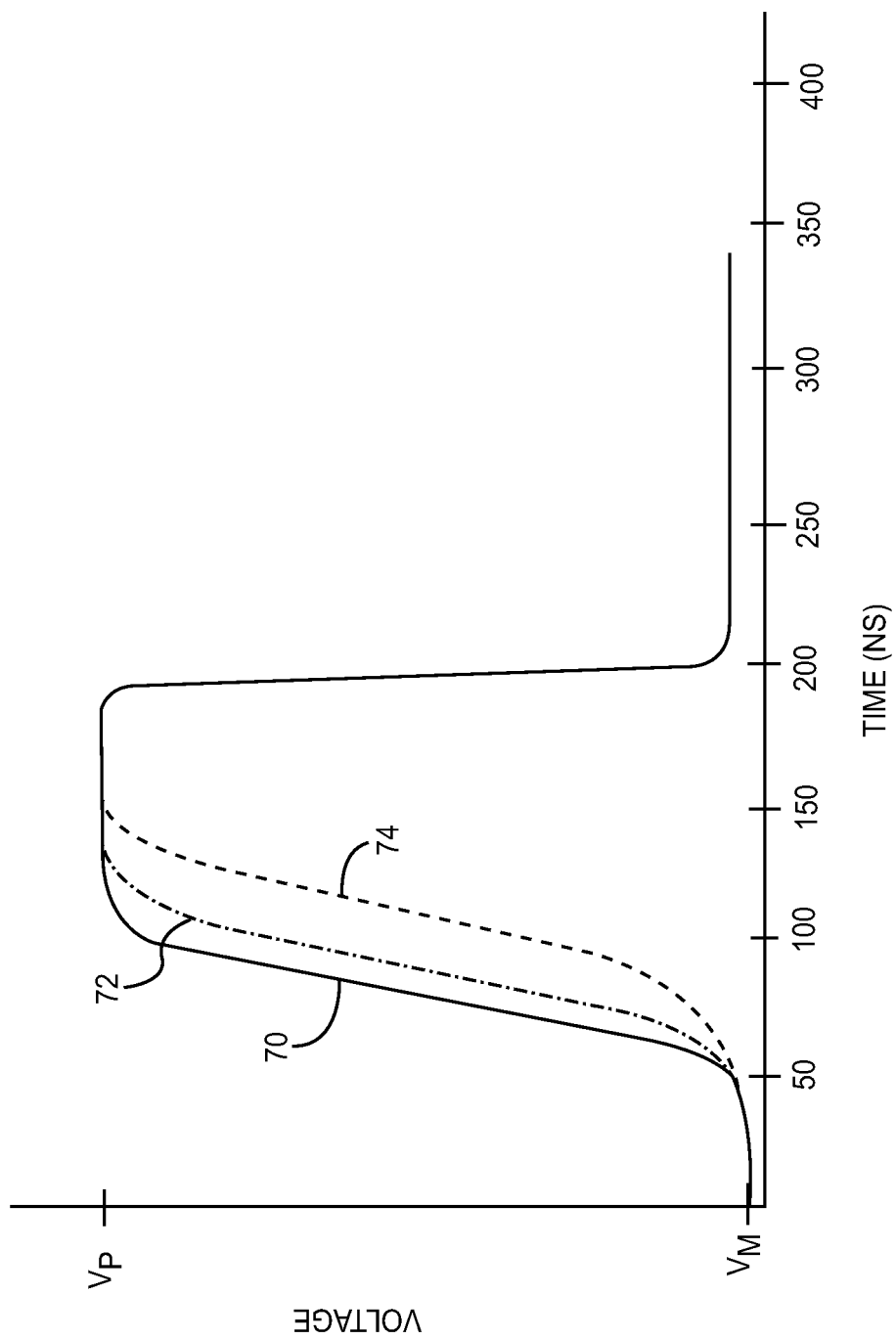
FIG. 7 illustrates different embodiments of a voltage across the power switch device as a function of a resistance of the variable resistive component shown in FIG. 6.

FIG. 7 illustrates different embodiments of the voltage across the input terminal 14 and output terminal 15. The voltage has a cycle period of around 400 nanoseconds and is seen essentially as a square wave when the power switch control signal 46 is varied at the base 40 of the bipolar transistor 28. Each of the curves 70, 72, and 74 illustrate the voltage as the variable resistance of the resistive component 66 is varied to different values. When the power switch device is turned off, the voltage seen across the D-FET 16 and the E-FET 26 is at the peak voltage $V_P$ which in this environment is around 1200 volts. When the power switch device 64 is turned on, the voltage seen across the D-FET 16 and E-FET 26 is at the minimum voltage $V_M$, which in this embodiment is near ground. The curve 70 represents the voltage response with the variable resistance of the resistive component 66 set to approximately 100 ohms. As shown in FIG. 7, the rising edge of the voltage is the quickest to transition from the minimum voltage $V_M$ to the maximum peak voltage $V_P$. The curve 72 represents the voltage response when the variable resistance is provided at approximately 400 ohms. As shown by FIG. 7, the increased resistance slows down or softens the rising edge. Finally, the curve 74 represents the voltage response when the variable resistance of the resistive component 66 is at 800 ohms. The higher resistance further decreases the sharpness of the rising edge and further softens the voltage response.

Figure 8:
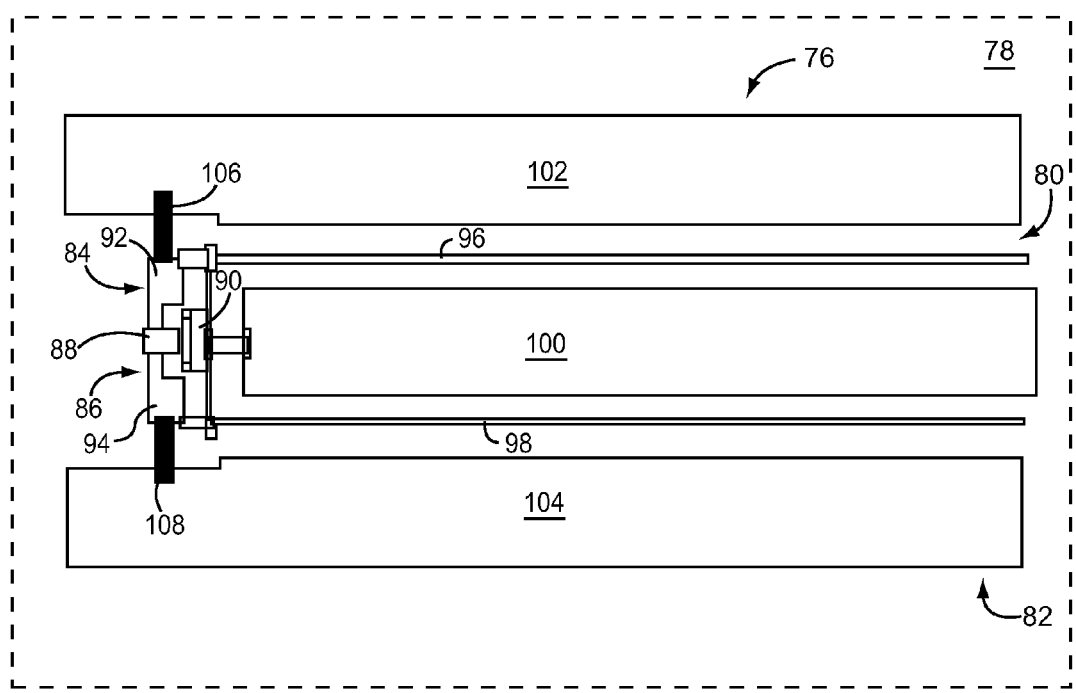
FIG. 8 illustrates one embodiment of a unit cell for providing an enhancement mode field effect transistor (E-FET) and the bipolar transistor monolithically integrated on a Gallium Arsenide (GaAs) substrate.

FIG. 8 illustrates one embodiment a unit cell 76 that may be formed on a GaAs substrate 78. The unit cell 76 includes a pair of E-FETs 80 and 82 and a pair of bipolar transistors 84 and 86. Each bipolar transistor 84 and 86 is monolithically integrated with one of the E-FETs 80 and 82, respectively, and is arranged as a Darlington transistor pair. The E-FET 80 and the bipolar transistor 84 are thus arranged as one Darlington transistor pair while the E-FET 82 and the bipolar transistor 86 are arranged as another Darlington transistor pair. Each of the Darlington transistor pairs are connected in parallel and share a common base 88 and collector 90. However, each of the bipolar transistors 84 and 86 have individual emitters 92 and 94.

Each of the emitters 92 and 94 are directly connected to one of the gate fingers 96 and 98. Each of the gate fingers 96 and 98 is for one of the E-FETs 80 and 82. Furthermore, the E-FETs 80 and 82 share a drain finger 100 but have individual source fingers 102, 104, respectively. A resistive component 106 and 108 is connected between each of the emitters 92, 94 and the source fingers 102, 104.

Figure 9:
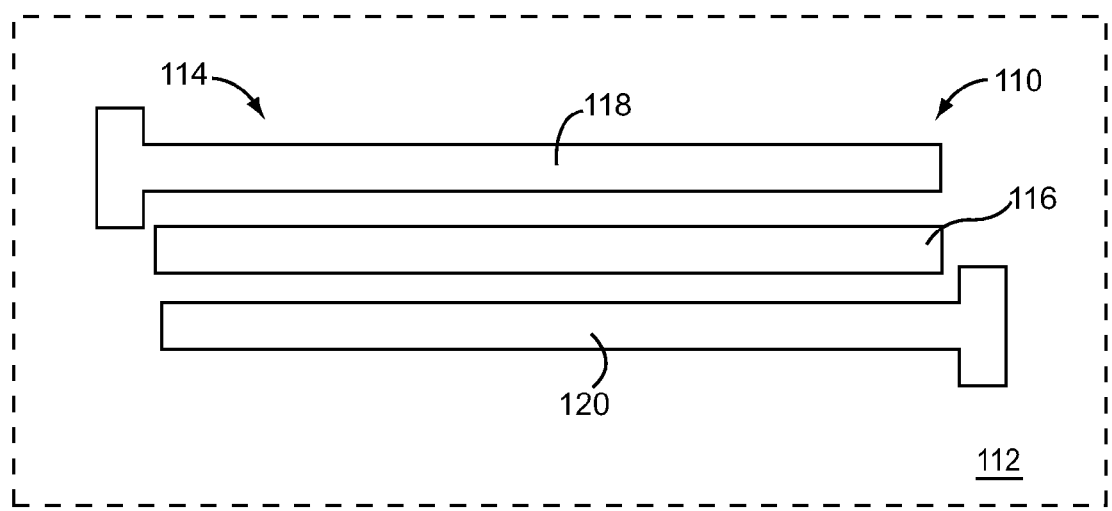
FIG. 9 illustrates one embodiment of a unit cell for providing a depletion mode field effect transistor (D-FET) on a Gallium Nitride (GaN) substrate.

FIG. 9 illustrates the layout of a unit cell 110 that may be formed on a GaN substrate 112. The unit cell 110 provides a D-FET 114. The D-FET 114 has a gate finger 116, a drain finger 118, and a source finger 120. The unit cell 110 in FIG. 9 may be coupled to the unit cell 76 in FIG. 8. Accordingly, in this example, a D-FET 114 is connected to a pair of E-FETs 80, 82. The E-FETs 80, 82 are in a Darlington arrangement with one of the bipolar transistors 84, 86, respectively. Thus, the single D-FET 114 is connected to two Darlington transistor pairs in parallel with one another. Thus, a transistor cell that provides a power switch device may be formed by one of the unit cells 110 formed on the GaN substrate 112 and one of the unit cells 76 formed on the GaAs substrate 78.

Figure 10:
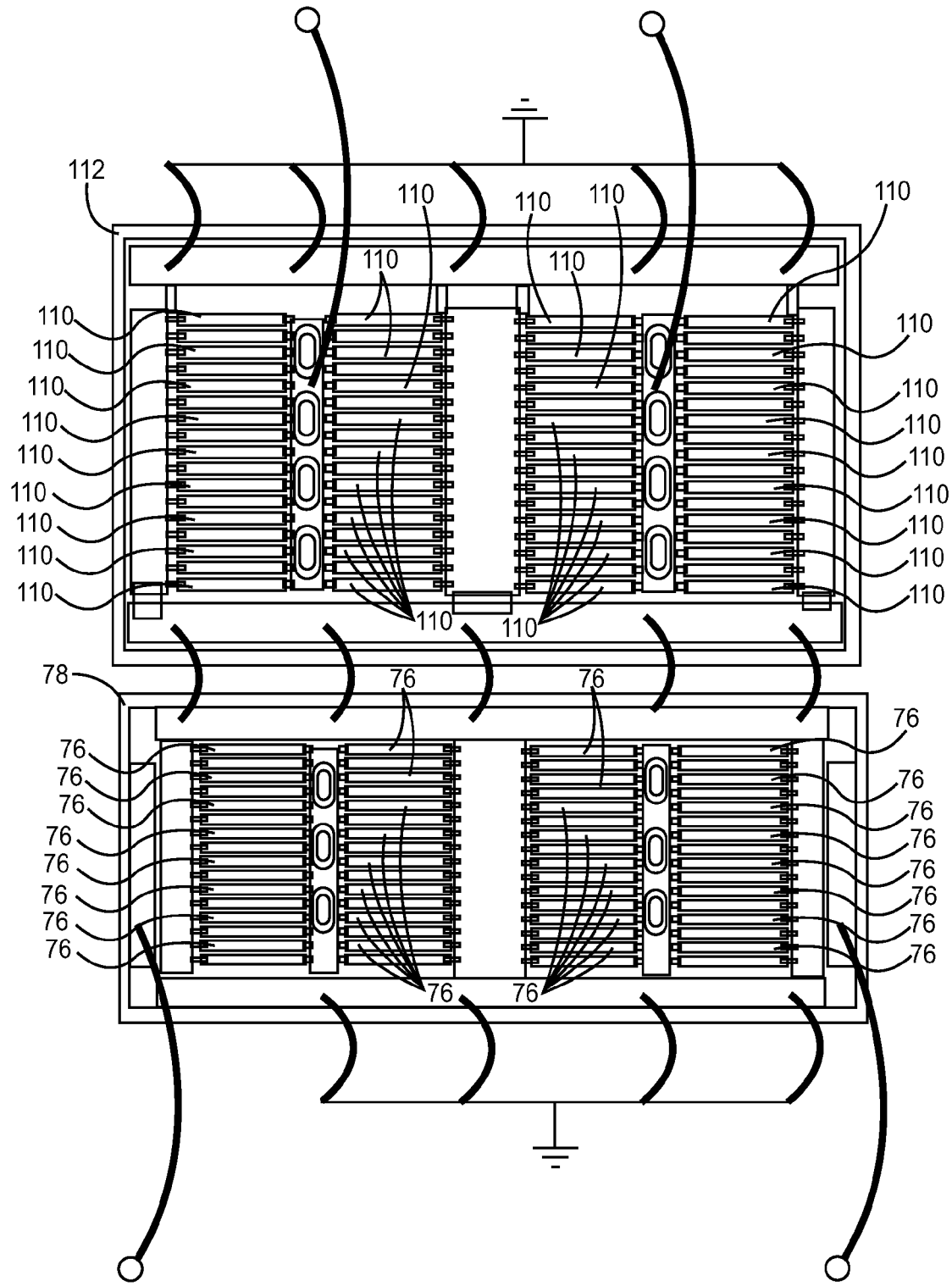
FIG. 10 illustrates one embodiment of a plurality of unit cells coupled in parallel and formed on the GaAs substrate and the GaN substrate.

FIG. 10 illustrates another embodiment where a plurality of unit cells 110 shown in FIG. 9 have been formed on the GaN substrate 112 and a plurality of unit cells 76 have been formed on the GaAs substrate 78. A plurality of the unit cells 110 on the GaN substrate are connected in parallel as one large D-FET device and is connected to a plurality of the unit cells 76 on the GaAs substrate 78 are connected in parallel as one large BiFET Darlington to provide a transistor cell that forms a power switch device. Since there are multiple unit cells 110 and multiple unit cells 76, a plurality of transistor cells are formed on the GaN substrate 112 and the GaAs substrate 78. Each power switch device may be formed by one of the unit cells 110 and one of the unit cells 76 coupled in parallel to one another. In this manner, the various power switch devices connected in parallel allow for large amounts of current to be handled in high current power applications. The E-FETs 80, 82 in each of the unit cells 76 are coupled in cascode with the D-FET 114 in each of the unit cells 110. The bipolar transistors 84, 86 in each of the unit cells 76 drive the current that turns on and turns off the E-FETS 82 and thereby turns on and turns off the D-FET 114.

Those skilled in the art will recognize improvements and modifications to the preferred embodiments of the present disclosure. All such improvements and modifications are considered within the scope of the concepts disclosed herein and the claims that follow.

What is claimed is:

1. A power switch device, comprising:
   a depletion mode field effect transistor (D-FET);
   an enhancement mode field effect transistor (E-FET) coupled in cascode with the D-FET such that turning off the E-FET turns off the D-FET and turning on the E-FET turns on the D-FET;
   a bipolar transistor operably associated with the D-FET and the E-FET such that turning on the bipolar transistor drives current from the D-FET through the bipolar transistor to the E-FET to provide a charge that turns on the E-FET.

2. The power switch device of claim 1, further comprising:
   a first semiconductor substrate wherein the E-FET and the bipolar transistor are monolithically integrated into the first semiconductor substrate.

3. The power switch device of claim 2 wherein:
   the first semiconductor substrate is a Gallium Arsenide substrate;
   the E-FET is a HEMT; and
   the bipolar transistor is an HBT.

4. The power switch device of claim 2, further comprising:
   a second semiconductor substrate, wherein the D-FET is formed in the second semiconductor substrate.

5. The power switch device of claim 4 wherein:
   the first semiconductor substrate is a Gallium Arsenide substrate;
   the E-FET is a HEMT;
   the bipolar transistor is an HBT;
   the second semiconductor substrate is one of a group consisting of a Gallium Nitride substrate, a Silicon Carbide substrate, and a Silicon substrate; and
   the D-FET is an HEMT.

6. The power switch device of claim 1 wherein:
   the E-FET has a drain, a source, and a gate;
   the bipolar transistor has a collector, an emitter, and a base.

7. The power switch device of claim 6, further comprising:
   a first semiconductor substrate wherein the E-FET and the bipolar transistor are monolithically integrated into the first semiconductor substrate such that the drain and the collector are directly connected and the emitter and the gate are directly connected.

8. The power switch device of claim 7 further comprising a resistive component coupled between the emitter and the source.

9. The power switch device of claim 8 wherein the resistive component is a passive resistor.

10. The power switch device of claim 8 wherein the resistive component is operable to provide a variable resistance.

11. The power switch device of claim 6 wherein the bipolar transistor is configured to receive a power switch control signal at the base, wherein the bipolar transistor is operable to turn on when the power switch control signal is above a first threshold voltage.

12. The power switch device of claim 11 wherein the E-FET is operable to turn on when there is a second threshold voltage between the gate and the source and is operably associated with the bipolar transistor such that the E-FET is turned on when the power switch control signal is above the first threshold voltage added to the second threshold voltage.

13. The power switch device of claim 6 wherein the charge is provided at the gate of the E-FET in order to turn on the E-FET.

14. The power switch device of claim 1 wherein the E-FET and the bipolar transistor are arranged as a Darlington transistor pair.

15. The power switch device of claim 1 wherein:
   the E-FET has a first drain, a first source, and a first gate;
   the bipolar transistor has a collector, an emitter, and a base;
   the D-FET has a second drain, a second source, and a second gate.

16. The power switch device of claim 15 further comprising:
   a Gallium Arsenide substrate wherein the bipolar transistor and the E-FET are monolithically integrated into the Gallium Arsenide substrate;
   a second semiconductor substrate that is one of a group consisting of a Gallium Nitride substrate, a Silicon Carbide substrate, and a Silicon substrate wherein the D-FET is formed by the second semiconductor substrate;
   the first gate and the second source are each coupled to ground;
   the first drain is configured to receive a power supply signal;
   the first source is coupled to the collector and the second drain that are provided by the same structure; and
   the base is configured to receive a power switch control signal.

17. The power switch device of claim 1 wherein the D-FET has a first breakdown voltage and the E-FET has a second breakdown voltage, the first breakdown voltage being higher than the second breakdown voltage.

18. The power switch device of claim 17 wherein the first breakdown voltage is significantly higher than the second breakdown voltage.

19. A power switch device, comprising:
   a plurality of depletion mode field effect transistors (D-FETs);
   a plurality of enhancement mode field effect transistor (E-FETs);
   a plurality of bipolar transistors;
   a plurality of transistor cells coupled in parallel to one another, each of the plurality of transistor cells having a corresponding D-FET of the plurality of D-FETs, a corresponding E-FET of the plurality of E-FETs, and a corresponding bipolar transistor of the plurality of bipolar transistors, and, wherein for each of the plurality of transistor cells:
   the corresponding E-FET is coupled in cascode with the corresponding D-FET such that turning off the corresponding E-FET turns off the corresponding D-FET and turning on the corresponding E-FET turn on the corresponding D-FET; and
   the corresponding bipolar transistor is operably associated with the corresponding D-FET and the corresponding E-FET such that turning on the corresponding bipolar transistor drives current from the corresponding D-FET through the corresponding bipolar transistor to the corresponding E-FET to provide a charge that turns on the corresponding E-FET.

20. The power switch device of claim 19 further comprising a first semiconductor substrate wherein, for each of the plurality of transistor cells, the corresponding E-FET and the corresponding bipolar transistor are monolithically integrated into the first semiconductor substrate.

* * * * *